United States Patent
Fujimura et al.

(10) Patent No.: US 7,014,788 B1
(45) Date of Patent: Mar. 21, 2006

(54) SURFACE TREATMENT METHOD AND EQUIPMENT

(75) Inventors: Shuzo Fujimura, Chiba (JP); Toshiyuki Takamatsu, Chiba (JP)

(73) Assignee: Jim Mitzel, Rocklin, CA (US)

( * ) Notice: Subject to any disclaimer, the term of this patent is extended or adjusted under 35 U.S.C. 154(b) by 0 days.

(21) Appl. No.: 09/328,939

(22) Filed: Jun. 9, 1999

Related U.S. Application Data

(60) Provisional application No. 60/088,739, filed on Jun. 10, 1998.

(51) Int. Cl.
*H01L 21/00* (2006.01)

(52) U.S. Cl. .................. 216/67; 216/69; 438/706; 134/1.1; 134/2

(58) Field of Classification Search .............. 216/67, 216/69; 134/1.1, 2; 438/706
See application file for complete search history.

(56) References Cited

U.S. PATENT DOCUMENTS

| | | | |
|---|---|---|---|
| 5,007,983 A * | 4/1991 | Lerner et al. | 438/725 |
| 5,089,441 A * | 2/1992 | Moslehi | 438/393 |
| 5,403,434 A * | 4/1995 | Moslehi | 134/1.2 |
| 5,403,436 A | 4/1995 | Fujimura et al. | |
| 5,620,526 A * | 4/1997 | Watatani et al. | 134/1.1 |
| 5,620,559 A * | 4/1997 | Kikuchi | 438/723 |
| 5,744,049 A * | 4/1998 | Hills et al. | 216/67 |
| 5,763,326 A * | 6/1998 | Barth | 438/714 |
| 5,885,361 A * | 3/1999 | Kikuchi et al. | 134/1.1 |
| 6,149,829 A | 11/2000 | Takamatsu et al. | |
| 6,551,939 B1 | 4/2003 | Takamatsu et al. | |
| 6,635,185 B1 * | 10/2003 | Demmin et al. | 216/64 |

FOREIGN PATENT DOCUMENTS

| | | |
|---|---|---|
| JP | 7-75229 | 4/1993 |
| JP | 19950005229 | 7/1996 |

OTHER PUBLICATIONS

Grill, Alfred, " Cold Plasma in materials Fabrication", 1993, pp. 230-231.*

Fujimura et al., "Study on Ashing Process for Removal of ion Implanted Resist Layer", Process Symposium, Dry Process, Procedure vol. 88-7, Honolulu, Hawaii, May 1987 (The Electro Chemical Society Inc. Pennington, 1988), pp. 126-133.

Fujimura et al., "Resist Stripping in an O+H20 Plasma Downstream", J. Vac. Sci. Technol. B9 (2), Mar./Apr. 1991, pp. 357-361.

Kikuchi et al., "Effects of H20 on Atomic Hydrogen Generation in Hydrogen Plasma", Jpn. J. Appl. Phys., vol. 32 (1993), Part 1, No. 6B, Jun. 1993, pp. 3120-3124.

(Continued)

*Primary Examiner*—Shamim Ahmed
(74) *Attorney, Agent, or Firm*—Townsend and Townsend and Crew LLP

(57) ABSTRACT

A method for treating material surface utilizing atomic hydrogen. The method includes utilizing atomic hydrogen by mixing halogen and/or halide to a gas which is used for generating, atomic hydrogen in the plasma. The present method also includes utilizing a characteristics of plasma downstream (11) in which the objective surface is prevented from physical damage caused by high energy particle and undesirable reactive species are controlled so as to avoid their influence. In an alternative embodiment, the present invention includes a method for a material surface treatment utilizing atomic hydrogen without the influence of atomic oxygen by using a gas, as a plasma source, containing the molecule and/or compound of chlorine, bromine and/or iodine and not containing molecules with oxygen atom.

14 Claims, 3 Drawing Sheets

OTHER PUBLICATIONS

Kikuchi et al., "Cleaning of Silicon Surfaces by NF3-Added Hydrogen and Water-Vapor Plasma Downstream Treatment", Jpn. J. Appl. Phys., vol. 35 (1996), Part 1, No. 2B, Feb. 1996, pp. 1022-1026.

Kim et al., "Recombination of O, N, and H Atoms on Silica: Kinetics and Mechanism", Langmuir 1991, vol. 7, No. 12, pp. 2999-3005.

Martin, "Diamond Film Growth in a Flowtube: A Temperature Dependence Study", J. Appl. Phys., vol. 70., No. 10, Nov. 15, 1991, pp. 5667-5674.

Papers by S. Fujimura, H. Yano, J. Konno, T. Takada, and K. Inayoshi: Study on aching process for removal ion implanted resist layer, Process Symposium, Dry Process, Procedure vol. 88-7, Honolulu, Hawaii May 1987 (The electro chemical Society Inc. Pennington, 1988) pp. 126-133.

J. Kikuchi, M. Iga, H. Ogawa, S. Fujimura, and H. Yano: Native oxide removal on Si surface by NF3-added hydrogen and water vapor plasma downstream treatment, Jpn. J. Appl. Phys., 35, 1022-1026 (1996).

J. VAC Sci Tehnol B, 9, 357-361 (1991).

L. Brown, J.Phys. Chem., 71, 2429 (1967).

Lee et al., "Chrome and Zinc Contaminants Removal from Silicon (100) Surfaces," *Jpn. J. Appl. Phys.,* 40:4002-4006 (2001). Jun.

Young C. Kim and Michael Boudant, recombination of O, N, and H atoms as Silica:Kinetics and mechanism , hagemuir, 7, 2999-3005 (1991), and L. Robbin Martin, "Diamond film growth in a flowtube : A temperature dependence study; J. Appl. Phys., 70, 5667-5674 (1991)".

* cited by examiner

SURFACE TREATMENT METHOD AND EQUIPMENT

CROSS-REFERENCES TO RELATED APPLICATIONS

This application claims priority to U.S. Ser. No. 60/088,739 filed Jun. 10, 1998, incorporated by reference herein.

BACKGROUND OF THE INVENTION

The present invention relates to objects and their manufacture. More particularly, the invention is illustrated in an example using a novel combination of gases and a downstream plasma surface for selectively treating surfaces for substrates used in semiconductor integrated circuits. Merely by way of example, the invention can be applied in the manufacture of other substrates such as flat panel displays, micro electrical mechanical machines ("MEMS"), sensors, optical devices, and others.

In the manufacture of objects such as integrated circuits, processing safety and reliability have been quite important. Fabrication of integrated circuits generally requires numerous processing steps such as etching, deposition, photolithography, and others. In the manufacture of semiconductor wafers, there have been used or proposed a variety of surface treatment methods. For example, there have been several documents which reported material surface treatments using the reaction of atomic hydrogen processed by a hydrogen containing gas plasma. Japanese Patent KOKAI H7-75229 and U.S. Pat. No. 5,089,441 appeared to show an ashing method of organic materials, which was carbonized by ion implant, in a hydrogen plasma in which a concentration of atomic hydrogen was increased by adding water vapor into the hydrogen plasma.

U.S. Pat. No. 5,089,441 reported a dry cleaning method of a semiconductor surface, which was performed by setting an objective semiconductor substrate in a downstream of a plasma generated with a mixture of a hydrogen molecule and germanium ("GeH$_4$"), hydrogen chloride, hydrogen bromide or hydrogen fluoride as the plasma gas source. Also it has been reported that the high concentration atomic hydrogen is obtained in plasma downstream area by the use of mixture of hydrogen and water vapor as the source gas for the plasma. (J. Kikuchi, S. Fujimura, M. Suzuki, and H. Yano), "Effects of H$_2$O on atomic hydrogen generation in hydrogen plasma," *Jpn. J. Appl. Phys.*, 32, pp. 3120–3124 (1993)).

Conventional plasma processing techniques using hydrogen, however, often cause undesirable results. For example, oxygen bearing plasmas often cause physical and/or electrical damage to surfaces being treated. Additionally, higher high energy particles also cause charging and physical damage to the treatment chamber itself. Conventional plasma processing techniques are also often difficult to control and may lead to plasma damage. These and other limitations of conventional systems are discussed more fully below.

From the above, it is seen that a technique for improving surface treatment processes is provided.

SUMMARY OF THE INVENTION

According to the present invention, a technique including a method and apparatus for the manufacture of treating objects is provided. In an exemplary embodiment, the present invention provides a novel technique for treating a surface of an object using a plasma treatment apparatus.

In a specific embodiment, the present invention provides a method for treating a material surface utilizing atomic hydrogen. The method includes utilizing atomic hydrogen by mixing halogen and/or halide to a gas which is used for generating atomic hydrogen in the plasma. The present method also includes utilizing characteristics of plasma downstream in which the objective surface is prevented from physical damage caused by high energy particle and undesirable reactive species are controlled so as to avoid their influence. In an alternative embodiment, the present invention includes a method for a material surface treatment utilizing atomic hydrogen without the influence of atomic oxygen by using a gas, as a plasma source, containing the molecule and/or compound of chlorine, bromine and/or iodine and not containing molecules with oxygen atom. Preferably, the plasma is substantially free from an oxygen bearing species.

In an alternative embodiment, the present invention provides an apparatus for treating a material surface downstream of a plasma. The present apparatus has a plasma discharge area to generate plasma discharge connected with a treatment area in vacuum, which is downstream from the plasma discharge. The apparatus also has a stage for setting objects in the treatment area. The treatment area includes the plasma, which is a mixture of a gas composed of molecules containing hydrogen atom as an element and a gas containing molecules and/or compound of chlorine, bromine, and/or iodine. The treatment area has at least an inner wall surface of the discharged area made of silicon nitride or other substantially inert material.

In a further alternative embodiment, the present invention provides an apparatus for treating a silicon wafer. The apparatus has a memory including computer codes. The memory includes a code directed to transferring a silicon wafer comprising an upper surface in a vacuum chamber using a transferring means. The silicon wafer has a layer of native oxide overlying the upper surface of the silicon wafer. The memory also has a code directed to switching a controller for applying a gaseous plasma discharge on the layer of native oxide to substantially remove the native oxide without physically damaging the surface of the silicon wafer. The gaseous plasma discharge is derived from an upstream plasma source from the vacuum chamber. The upstream source comprises a hydrogen bearing species and a halogen bearing species; wherein the upstream plasma source being substantially free from an oxygen bearing species. The present invention can also include many other computer codes, which carry out the functionality described herein, as well as others.

Numerous advantages are achieved by way of the present invention over conventional techniques. The present invention provides a combination of gases for improved plasma processing. In other aspects, the present invention provides for a substantially effective plasma treatment technique that does not cause substantial physical damage to the surface being treated. In still other aspects, the present invention provides for a technique that can be easily implemented using conventional fabrication gases, which are well known. Depending upon the embodiment, one or more of these benefits exist. These and other benefits and advantages are shown in more detail below.

The present invention achieves these benefits in the context of known process technology. However, a further understanding of the nature and advantages of the present invention may be realized by reference to the latter portions of the specification and attached drawings.

DESCRIPTION OF THE SPECIFIC EMBODIMENTS

Figure 1:
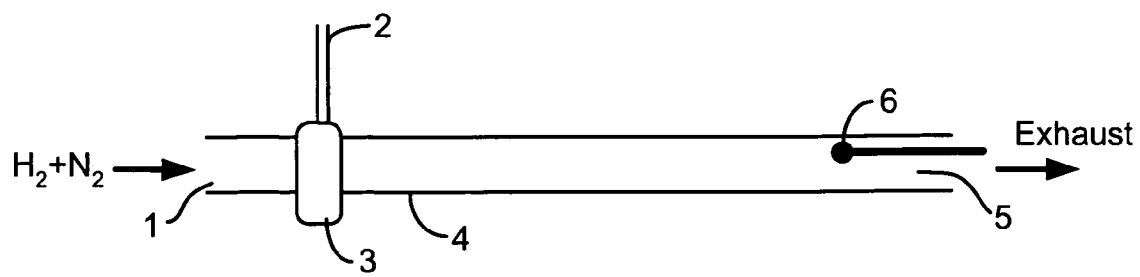
FIG. 1 is a simplified diagram of a plasma treatment tool according to an embodiment of the present invention.

According to the present invention, a technique including a method and apparatus for the manufacture of treating objects is provided. In an exemplary embodiment, the present invention provides a novel technique for treating a surface of an object using a plasma treatment apparatus, which has a downstream configuration.

In a specific embodiment, the present invention provides a method for forming an environment of a high concentration of atomic hydrogen in plasma downstream from a plasma source, where an influence of high energy species such as ions, electrons, and photons generated by the plasma discharge can be substantially ignored or reduced. Moreover, it has been discovered that silicon ("Si") native oxide could be eliminated at low temperature in an $NF_3$ injected downstream of an $H_2+H_2O$ plasma (J. Kikuchi, M. Iga, H. Ogawa, S. Fujimura, and H. Yano, "Native oxide removal on Si surface by $NF_3$-added hydrogen and water vapor plasma downstream treatment", *Jpn. J. Appl. Phys.*, 33:2207–2211 (1994)). The Si native oxide removal process with $NF_3$-added hydrogen and water vapor plasma downstream treatment achieved the removal of Si native oxide even at nearly room temperature in vacuum environment and formation of a hydrogen terminated Si surface. Thus, the present process can replace the conventional high temperature hydrogen gas pretreatment of Si epitaxy. (J. Kikuchi, M. Nagasaka, S. Fujimura, H. Yano, and Y. Horiike, "Cleaning of silicon surface by $NF_3$-added hydrogen and water-vapor plasma downstream treatment", *Jpn. J. Appl. Phys.*, 35, 1022–1026 (1996)). In addition, it was suggested to use this method for the several application of silicon based semiconductor manufacturing process such as the cleaning of contact hole of ULSI devices (J. Kikuchi, M. Suzuki, K. Nagasaka, S. Fujimura, "The Si native oxide removal with using $NF_3$-added hydrogen and water-vapor plasma downstream treatment", "Extended Abstracts" (The 44th Spring Meeting, 1997); *The Japan Society of Applied Physics and Related Societies*, vol. 1, pp. 997, (29p-W6) in Japanese).

The Japanese Patent H6-338478 might be applied due to above reference method, which indicates that mixture of hydrogen molecule and water vapor was not only available gas for source gas of the plasma but any plasma containing hydrogen was available for the source gas of the plasma to which downstream $NF_3$ was injected. In AHP-001, moreover, it was indicated that the silicon dioxide was also etched in an $NF_3$ injected downstream of a plasma generated using the mixed gas of nitrogen and a few percent water vapor or hydrogen molecule by the catalytic effect of nitrogen at metastable state.

These technologies were developed to utilize the effect of atomic hydrogen. However, the using of the mixture of hydrogen molecule and water vapor or oxygen molecule as a plasma gas source is an only concrete method for supplying a high amount of atomic hydrogen into the downstream region where effects of high energy species from plasma, such as electron, ion and short wave length photon (Ultra Violet), can be ignored. As regarding the Japanese Patent KOKAI H7-75229, organic molecules containing hydrogen and oxygen and inorganic hydride molecules were listed up for the gas which should be mixed to the hydrogen molecule gas and more concretely, alcohol, organic acid, ether, phosphine ("$PH_3$"), arsine ("$AsH_3$"), borane ("$BH_3$"), diborane ("$B_2H_6$"), water vapor ("$H_2O$"), silane ("$SiH_4$") and ammonia ("$NH_3$") were introduced as the organic molecules and inorganic hydride.

Among these gases, alcohol or organic acid is containing oxygen thus generating water vapor in the mixed gas plasma with hydrogen molecules. In some other gases such as silane and phosphine, they themselves are reductive. Therefore, contribution of atomic hydrogen to reductive reaction in the downstream of those gases plasma is not clearly confirmed. Actually, U.S. Pat. No. 5,403,436 introduced a surface cleaning by reduction effect of germanium ("GeH4") mixed into hydrogen molecule. In addition, ammonia ("NH3") itself is well known as a reductive gas.

It has been known that ammonia is synthesized by a hydrogen and nitrogen gas plasma. The hydrogen and nitrogen mixture in which mixing ratio of hydrogen molecule and nitrogen molecule is about 3 to 1 is typically used for the synthesis. In Japanese Patent KOKAI H7-75229, the highest concentration of atomic hydrogen is obtained when concentration of nitrogen in the hydrogen-nitrogen mixture was 25%, in other words, hydrogen-nitrogen mixing ratio was 3 to 1. This indicates that if ammonia has the ability of transporting atomic hydrogen to downstream region, the downstream with high concentration of atomic hydrogen is probably obtained when the concentration of nitrogen molecule in the mixture as the plasma gas source is around 25% or hydrogen concentration is larger than that of nitrogen but smaller than 90%. In AHP-001, however, etching amount of silicon dioxide based upon the reaction of atomic hydrogen and $NF_3$ drastically increased at smaller hydrogen molecule concentration than 10%.

Atomic hydrogen concentration in downstream region, which was measured by calorimetry method to measure atomic hydrogen flow, is described in Young C. Kim and Michel Boudart, "Recombination of O, N, and H Atoms on Silica: Kinetics and Mechanism," *Langmuir*, 7:2999–3005 (1991) and L. Robbin Martin, "Diamond film growth in a flow tube: A temperature dependence study", *J. Appl. Phys.*, 70:5667–5674 (1991), abruptly increased when the hydrogen concentration in the hydrogen-nitrogen mixture was less than 20% and reached maximum concentration at hydrogen molecule concentration of 2% in the mixture. This has indicated the mechanism of transporting atomic hydrogen from plasma discharge area to downstream region by hydrogen-nitrogen mixture plasma is completely different from that by the hydrogen and water vapor mixed plasma gas source.

Furthermore, it is also suggested that ammonia does not have effect to transport atomic hydrogen from plasma to downstream region as like water vapor. In Japanese Patent KOKAI H7-75229, the treatment at downstream area is described in FIG. 5(b) and its description and species caused transport effect of atomic hydrogen is water vapor. The gas for transporting atomic hydrogen is water vapor and the molecule containing oxygen atom also in Japanese Patent H6-338478.

When the molecules containing oxygen as its element such as water vapor mixed with hydrogen molecules to transport atomic hydrogen from the plasma to the downstream, the mixture of the gas containing oxygen and hydrogen absolutely generates oxidative species such as atomic oxygen and hydroxyl molecule ("OH") in the plasma. These oxidative species also reach downstream region and oxidize the objected material surface. It has been reported by Kikuchi et al. (J. Kikuchi, S. Fujimura, M. Suzuki, and H. Yano, "Effects of $H_2O$ on atomic hydrogen generation in hydrogen plasma," *Jpn. J. Appl. Phys.*, 32:3120–3124 (1993)) that the atomic oxygen and hydroxyl molecules was detected even in the downstream of the plasma generated with the hydrogen-water vapor mixture with water vapor of 5%. It has been also reported that the surface of hydrogen surface terminated silicon substrate not having its native oxide on the surface is oxidized at downstream region on hydrogen and water vapor gas plasma (J. Kikuchi, "The research of dry cleaning technology of silicon surface in integrated circuit manufacturing process", *Doctoral Dissertation*, Kyoto University, 1997). Therefore, it is not possible to know the method of surface treatment with using atomic hydrogen without having the effect of high energy species and atomic oxygen or molecule containing oxygen atom referring from Japanese Patent KOKAI H7-75229 and Japanese Patent H6-338478.

FIG. 1 is a simplified diagram of a tool of an experimental system according to the present invention. This diagram is merely an example, which should not limit the scope of the claims herein. One of ordinary skill in the art would recognize many other variations, modifications, and alternatives. Among other elements, the system includes a gas inlet 1, which couples to a process tube or chamber 4. The process tube includes a microwave cavity 3, which includes a microwave wave guide 2. The tool also includes an exhaust 5. A thermocouple 6 is disposed in the process tube. The present tool can be used to investigate an atomic hydrogen concentration at a plasma downstream location, which is estimated by a calorimetry method.

Figure 2:
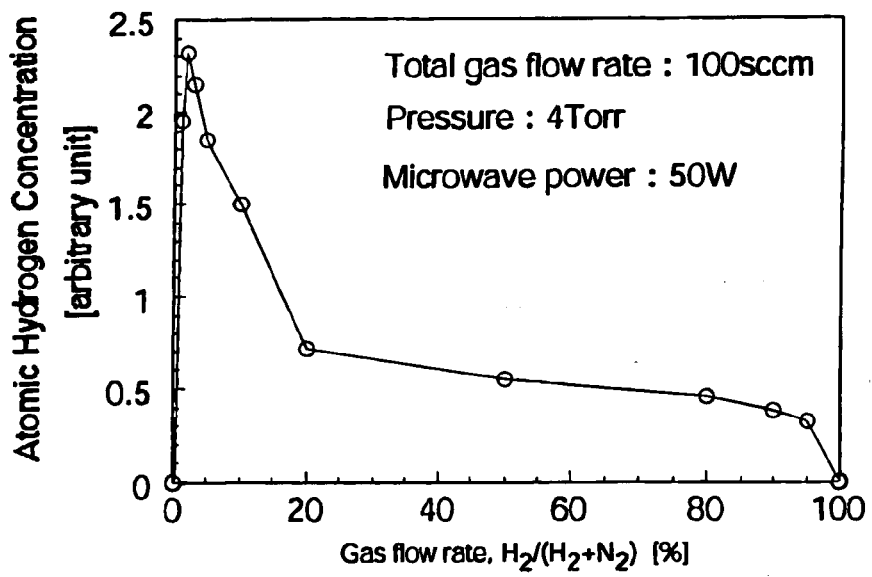
FIG. 2 is a simplified diagram of a concentraton plotted against flow rate according to an embodiment of the present invention.
Figure 3:
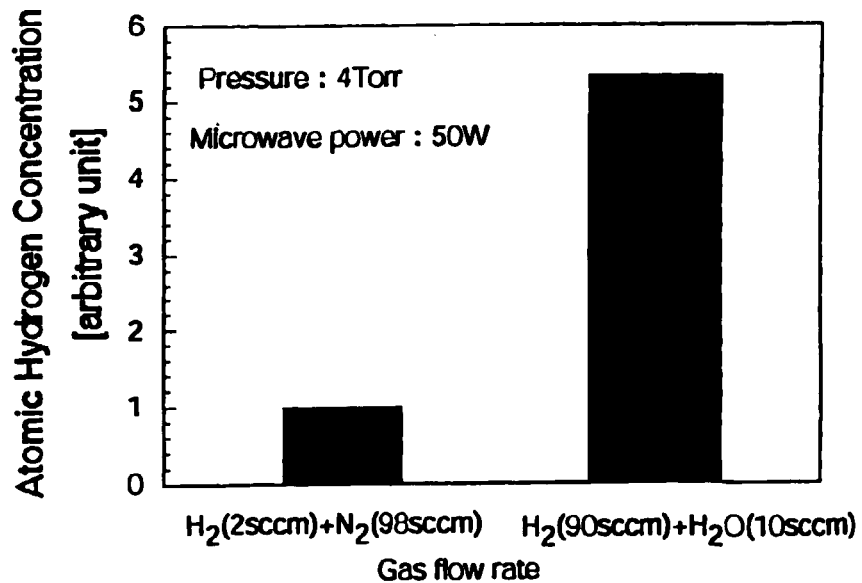
FIG. 3 is a simplified diagram of a concentraton plotted against flow rate according to an alternative embodiment of the present invention.

A dependence of nitrogen gas and hydrogen gas flow rates on atomic hydrogen concentration at a downstream plasma location is illustrated in a simplified diagram of FIG. 2. This diagram is merely an illustration, which should not limit the scope of the claims herein. As shown, higher hydrogen gas percentage flow rate generally decreased atomic hydrogen concentration. A comparison of atomic hydrogen concentration in downstream region with using an experimental unit is shown in FIG. 1. This comparison is between mixing a hydrogen and a nitrogen gas process and between mixing hydrogen and water vapor gas process indicate that this concentration at the case of mixing hydrogen and nitrogen gas process is around 1/5 compare with the case of mixing hydrogen and water vapor gas process shown in FIG. 3. Therefore, it is projected that the atomic hydrogen treatment efficiency for the objected material at mixing hydrogen and nitrogen gas plasma process is worse than mixing hydrogen and water vapor gas plasma process case. In order to achieve the effective atomic hydrogen surface treatment of objective material without the effect of high energy species from plasma and atomic oxygen or molecule containing oxygen atom, the treating objective material surface located at downstream region of the gas plasma which is generated with a gas at least containing molecules containing hydrogen atom as its element and halogen and/or halide.

To transport atomic hydrogen to a downstream region without the influence of atomic oxygen and/or molecules containing oxygen atom as its element as same as or more than the hydrogen-water vapor mixture. For example, it is one of the possible methods to use a gas, which does not contain oxygen, as its element but has same effects as the water vapor. Thus, it is required well understanding of the mechanism of atomic hydrogen transportation to downstream region at mixing hydrogen and water vapor gas plasma process case, but there is no indication for this mechanism in Japanese Patent KOKAI H 7-75229 and Japanese Patent H6-338478. However, it is suggested in Kikuchi's (J. Kikuchi, S. Fujimura, M. Suzuki, and H. Yano, "Effects of $H_2O$ on atomic hydrogen generation in hydrogen plasma",*Jpn. J. Appl. Phys.*, 32:3120–3124 (1993)), that the water vapor effect of transporting atomic hydrogen does not last long and depends on temperature of quartz which composed inner wall of an equipment chamber. This indicates that water molecules physically adsorbed on the quartz surface prevents recombination of atomic hydrogen. These result are indicated the considerable mechanism of physical adsorption of water molecule on quarts surface as follows.

Water molecule is a polar molecule, thus, oxygen atom in the water molecule is charged negatively. On the other hand, quartz ("$SiO_2$") or alumina ("$Al_2O_3$") as the reactor material is also polarized. Thus, for example, Si atom in the quartz ("$SiO_2$") is slightly charged with electrically positive and oxygen atom is slightly charged with electrically negative. Thus, a water molecule probably adsorbs on the quartz surface as the oxygen atom in the water molecule stuck on the silicon of the quartz and two hydrogen atoms in water projected into opposite direction of the quartz silicon. Another structure of water molecule adsorption in which a hydrogen atom of the water molecule sticks on an oxygen atom in silicon dioxide is considerable, but such structure is probably unstable since heavy oxygen atom in the water molecule locates upward. Therefore, it is acceptable that, in the downstream of the hydrogen-water vapor plasma, quartz surface as the chamber wall was covered by physisorbed water molecules and then hydrogen atoms of water molecules located at outermost position of chamber wall surface. This considerable mechanism is not verified in this application. However, it is fact that the adsorption of molecules on a solid surface depends upon the polarization of molecules and the above results strongly indicated that the adsorption of water molecule on the quarts surface provide the effect of atomic hydrogen transportation, thus hydride molecules having strong polarization should be able to use instead of water vapor.

Figure 4:
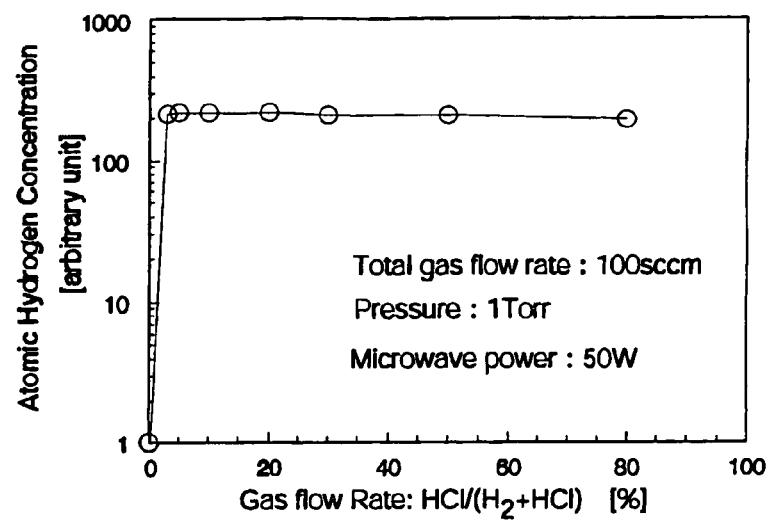
FIG. 4 is a simplified diagram of a concentraton plotted against flow rate according to an alternative embodiment of the present invention.
Figure 5:
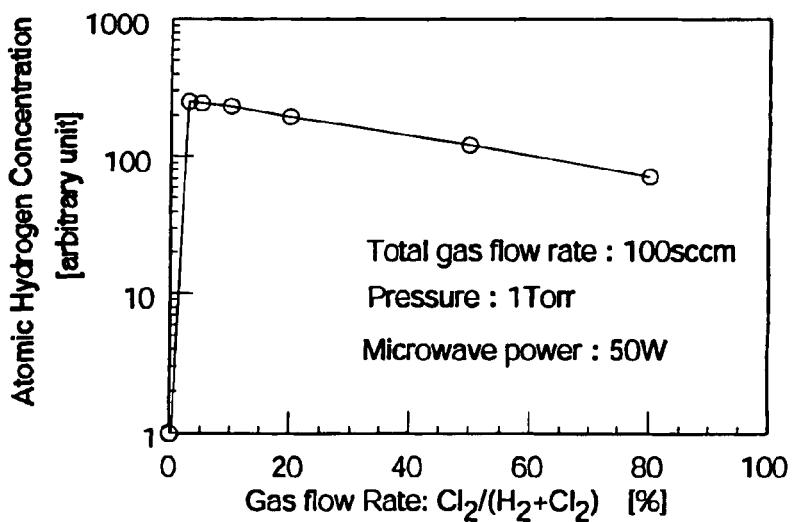
FIG. 5 is a simplified diagram of a concentraton plotted against flow rate according to an alternative embodiment of the present invention.

FIG. 4 shows a concentration of atomic hydrogen at downstream region of a plasma of hydrogen-hydrogen-chloride mixture measured by calorimetry method using the experimental equipment shown in FIG. 1. FIG. 5 shows the result at mixture of hydrogen and chlorine molecule ("$Cl_2$") gas plasma process. Both results show the dramatic increase in atomic hydrogen concentration at downstream region and the concentration in the both is as same as that in the mixture of the hydrogen and water vapor. The reason why unpolarized chlorine molecules showed the same effect as hydrogen-chloride is because hydrogen-chloride was synthesized in the plasma from chlorine and hydrogen, and this is same manner as the case that oxygen molecule has the same effect on atomic hydrogen transporting as the water vapor.

Figure 6:
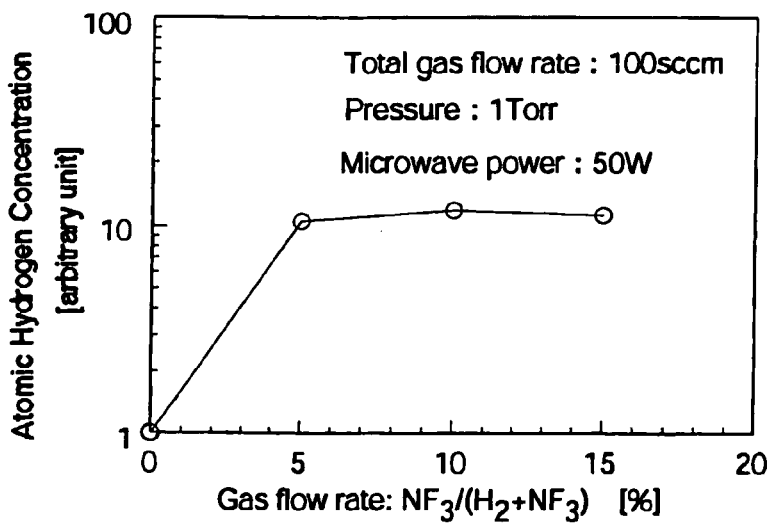
FIG. 6 is a simplified diagram of a concentraton plotted against flow rate according to an alternative embodiment of the present invention.

FIG. 6 shows the concentration of atomic hydrogen at downstream region of a plasma of hydrogen and nitrogen-trifluoride ("$NF_3$") mixture. This mixture also shows the same effect as hydrogen-chloride ("HCl"), chlorine molecule ("$Cl_2$") and water vapor. This is probably because, hydrogen fluoride having strong polarization was synthesized in the plasma and transported atomic hydrogen. In this case, however, since quartz is etched by atomic fluorine and fluorine ion, oxygen released from the quartz might somewhat contribute to atomic hydrogen transpiration.

Above results indicate that hydrogen-halide and halogen, which generates hydrogen-halide by reaction with hydrogen in the plasma, has the effect of transporting atomic hydrogen to downstream. U.S. Pat. No. 5,403,434 mentions a dry cleaning method that objective surface is treated in the downstream of a plasma with hydrogen mixture containing HCl, HBr, or HF, or directly exposed in the downstream of a hydrogen plasma to HCl, HBr, or HF, which independently was introduced into treatment chamber. In this document, recommended mixing amount of HCl, HBr or HF are, less than 50 SCCM for HCl or HBr into 12000 SCCM $H_2$ and less than 10 SCCM for HF into 12,000 SCCM $H_2$. Namely, mixing ratio of 0.42% to total gas flow is preferable for HCl and HBr and that of 0.083% is preferable for HF. From FIG. 4, however, small amount of HCl of about 0.42% scarcely has the effect of transporting atomic hydrogen. FIG. 5 shows the results of experiment used $NF_3$ as an additive gas to hydrogen. They were not the results of HF mixing. However, almost of fluorine dissociated from $NF_3$ probably makes HF by recombination with hydrogen during flowing from the plasma to the objective surface. Thus, HF of about 0.08% would be produced from $NF_3$ of about 0.27% even if dissociation ratio of $NF_3$ in the plasma was 10%. (This estimation is based on the assumption that three fluorine atoms dissociated from $NF_3$ of 10% makes three HF molecules). The results obviously shows that such small amount of $NF_3$ does not have enough level of atomic hydrogen transportation effect. Moreover, sapphire is recommended for the material of chamber wall more than quartz in U.S. Pat. No. 5,403,434 to avoid degradation of the equipment. Its reason is not clarified, but phenomena is confirmed that atomic hydrogen can not be transported to the downstream even in the hydrogen-water vapor plasma when a sapphire reactor is used instead of a quartz reactor. Therefore, the recommended process in U.S. Pat. No. 5,403,434 is out of range utilize atomic hydrogen and it is not possible to imagine this invention of halogen effect from U.S. Pat. No. 5,403,434. Actually, purpose of HCl or HF described in U.S. Pat. No. 5,403,434 is their direct operation to the surface reaction such as elimination of metallic contaminants by HCl, thus, transporting effect of atomic hydrogen is not mentioned there at all.

Therefore, an atomic hydrogen plasma downstream processing with no or minimized or reduced influence of atomic oxygen and/or molecule containing oxygen atom can be performed by setting objective materials in the downstream of a plasma generated with a mixture of molecules containing a hydrogen atom as its element and halogen and/or halide. In a plasma, material element composing a reactor wall is mixed into the plasma through sputtering and/or etching reaction by high energy particles, but influence of oxygen form the reactor wall will be avoided by composing the reactor wall surface exposed to the plasma of silicon nitride or silicon oxynitride or other material. A reactor made of silicon nitride or a quartz or alumina (includes sapphire) reactor of which surface exposed to the plasma covered by silicon nitride, is considerable as this embodiment.

Figure 7:
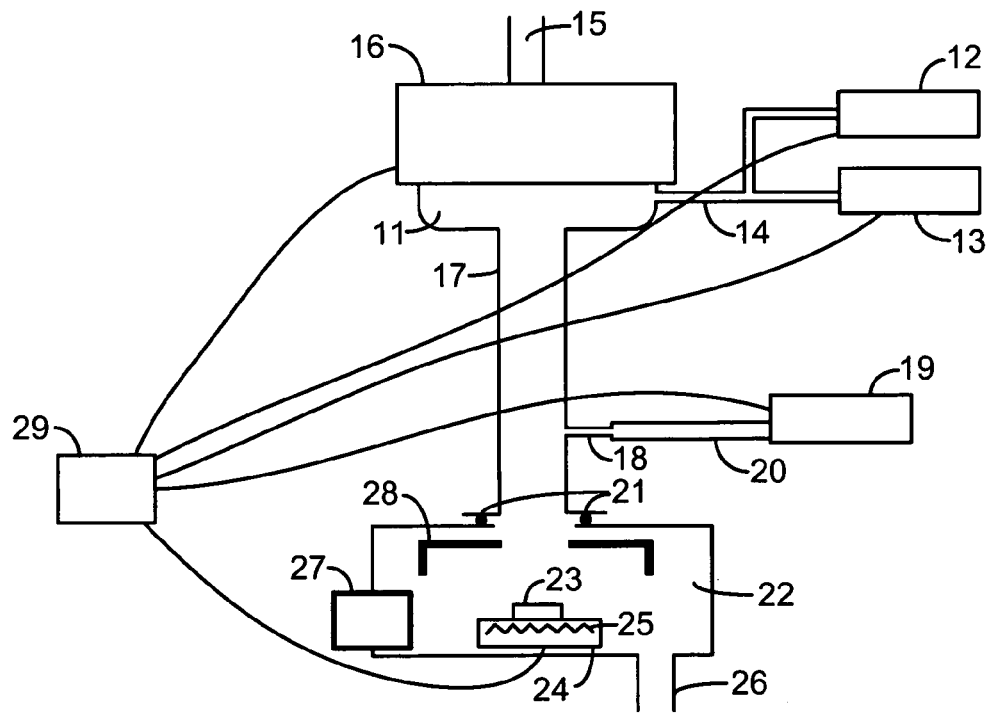
FIG. 7 is a simplified diagram of a plasma processing tool according to an embodiment of the present invention.

FIG. 7 shows an apparatus for practical surface processing according to the present invention. This diagram is merely an illustration, which should not limit the scope of the claims herein. One of ordinary skill in the art would recognize many other variations, modifications, and alternatives. The present apparatus includes a plasma discharge room 11 for a plasma source gas. The discharge room is generally made of a material such as quarts, alumina or silicon nitride. The inner wall may be coated with a silicon nitride film in case of quarts and alumina. The apparatus also includes a Gas-A supply unit 12 and a Gas-B supply unit 13. Each of these units include a mass flow controller, which couples to a valve, which introduces filtered gas. Mixed Gas-C, which is mixed with Gas-A provided Gas-A supply unit 12 and Gas-B provided Gas-B supply unit 13, is introduced into plasma discharge room 11 through the fitting 14, which is generally a tube or plurality of tubes, which may include a by-pass. Mixed Gas-C introduced into the plasma discharge room 11 is discharged into plasma by a microwave power source, which is supplied to microwave cavity 17 through microwave guide 16 from microwave generator 15. A nozzle 18 to add another gas is set at a suitable point in a downstream region of the plasma discharge area in the plasma discharge room 11. Gas-D is able to be injected into plasma downstream through the fitting-20 (or tube) from Gas-D supply unit 19. Gas-D supply unit 19 is composed with mass flow controller, valve and filter, which can selectively introduce Gas-D into the discharge room.

Plasma discharge room 11 is connected with treatment room 22 with O-ring 21, which seal the discharge room to the treatment room. Other ways of sealing each of these rooms together may also be used. The surface of object 23 which placed inside of the treatment room 22 is processed by the gas which is prepared by discharged Gas-C and injected Gas-D. The object 23 is mounted on stage 24 and Si—C heating unit 25 is furnished at upper section of stage 24 in order to heat up the object 23. The treatment room 22 has vacuum exhaust port 26 and connected to the rotary vacuum pump which is not shown in this schematic. The treatment room 22 also has the material transport port 27 in order to load and unload the object. Inner wall part 28 can be set inside of treatment room 22 in order to protect the wall side of the treatment room 22 or any other reason. In a specific embodiment, the discharge room and the treatment room are placed away from each other at a suitable point. Here, the suitable point is a location where the detrimental influences of the plasma discharge are maintained away from the treatment room.

In a specific embodiment, the present apparatus also includes a controller 29. The controller is generally a microprocessor based unit, which includes inputs and outputs. The microprocessor based unit oversees and monitors the process parameters and operation of the present apparatus. In a preferred embodiment, the present controller is software based, which can be updated by the user. The software based process has a variety of computer codes, which carry out the functionality of the processes described herein. The present controller is coupled to each of the mass flow controllers, is coupled to the power source, and also controls parameters such as pressure, temperature, time, and the like. Depending upon the embodiment, the present invention can also include many other aspects.

While the above is a full description of the specific embodiments, various modifications, alternative constructions and equivalents may be used. Therefore, the above description and illustrations should not be taken as limiting the scope of the present invention which is defined by the appended claims.

EXAMPLES

To prove the principle and operation of the present invention, examples have been provided. These examples are merely illustrations, which should not limit the scope of the claims herein. One of ordinary skill in the art would recognize many other variations, modifications, and alternatives. The present examples can be implemented using a tool such as the one in FIG. 7. The examples are as follows:

First Example

In the present example, the present method introduces gases (i.e., $H_2$: 90 SCCM, $Cl_2$: 10 SCCM) as a plasma source was activated in a tool similar to the one in FIG. 7. The plasma source was activated with 500 watt 2.45 GHz microwave, but can also be at other powers. An $NF_3$ gas (at 100 SCCM) was added at a downstream area, while 6 inch Si wafer covered by silicon native oxide film mounted on a stage in the plasma tool. The silicon wafer surface was hydrophobic after plasma processing for 3 minutes at 2 Torr., which indicates that the silicon native oxide film was removed by this processing.

As well as the above, mixed gases (i.e., $H_2$: 9 SCCM, HCl: 10 SCCM) as the plasma source gas was activated. The plasma was maintained at 500 watt 2.45 GHz microwave. An $NF_3$ gas (at 100 SCCM) was added at a downstream area from the plasma source. A 6 inch Si wafer covered by silicon native oxide film was mounted on the stage in the plasma tool. The silicon wafer surface was hydrophobic after the treatment for 3 minutes at 2 Torr, which also indicates that the silicon native oxide film was removed by this processing.

Second Example

In the present example, mixed gases (i.e., $H_2$: 90 SCCM, $Cl_2$: 10 SCCM) are used as the plasma source gas in a tool similar to the one in FIG. 7. This source gas was activated with a power source including 500 watts at 2.45 GHz microwave energy. Silane (i.e., $SiH_4$) gas (at 5 SCCM) was added at downstream area from the plasma processing region. A 6 inch Si wafer covered by silicon dioxide film was mounted on the stage in the plasma processing region, which was downstream from the plasma source. Then, the wafer temperature was elevated to 450° C. and maintained at such temperature. The processing pressure was pumped down to 2 Torr and also maintained at such pressure. In the present example, a deposited film was observed on the wafer surface after the processing the wafer for 1 hour. We believe that such film was a silicon film because the silicon wafer surface was completely hydrophobic just after the processing.

Third Example

The mixed gases (i.e., $H_2$: 90 SCCM, $Cl_2$: 10 SCCM) are used as the plasma source gas has been activated with power at 500 watt and 2.45 GHz microwave in a tool similar to the one in FIG. 7. An ethyl alcohol (at 5 SCCM) was added at downstream area from the plasma source. A 6 inch bare Si wafer was mounted on the stage, which sits downstream from the plasma source. Then, the wafer temperature was elevated to 700° C. and was maintained at such temperature. The processing pressure was pumped down to 2 Torr, and also maintained at such pressure The wafer surface discolored after the processing for 3 hour, which indicates that there is a deposited film on the wafer surface. The composition of the deposited film was deduced by oxygen plasma treatment.

Figure 8:
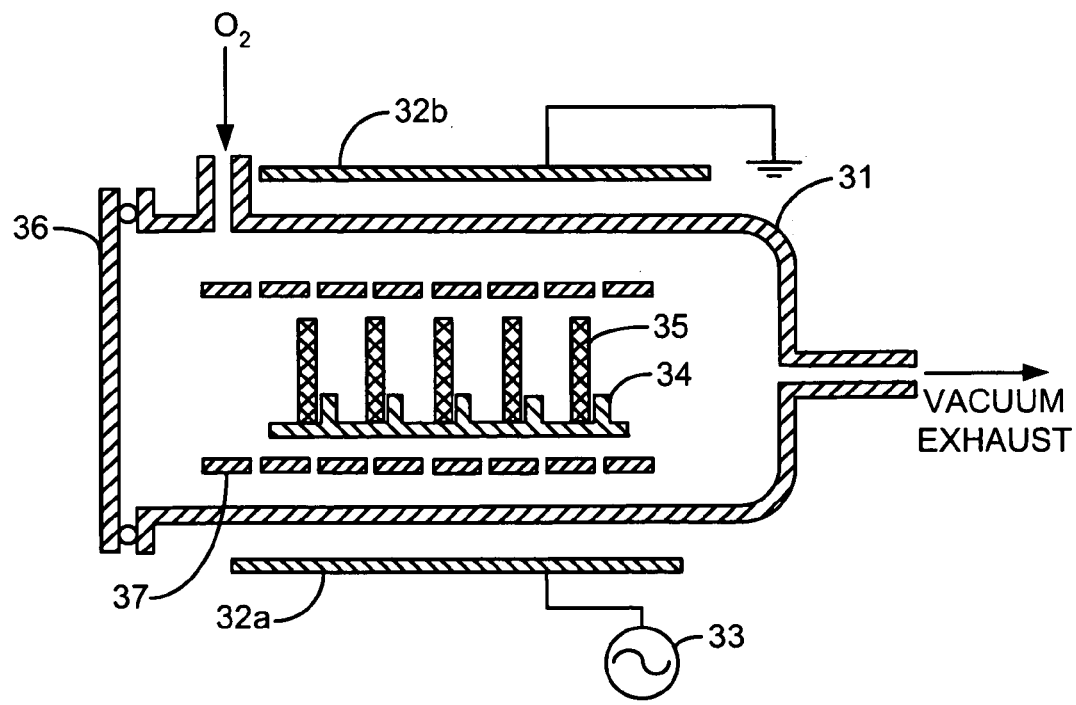
FIG. 8 is a simplified diagram of a plasma processing tool according to an alternative embodiment of the present invention.

FIG. 8 shows a simplified barrel type plasma ashing system using oxygen plasma treatment. The wafer 35 on the wafer carrier 34 was treated by oxygen plasma, which is generated inside of quartz reaction tube 31 induced oxygen and supplied RF power into the electrode 32a and 32b from RF generator 33. Wafer 35 is load and unload at the part of open side of quarts tube 31, and use cover 36 at the processing time to cover quarts open side. Aluminum etch tunnel 37 is also available. Previous processed Si wafer with a deposition film was processed with this type of oxygen ashing system under condition of oxygen gas flow 500 SCCM, 1 Torr and 300 watt RF power for 30 minute. Since the color of wafer surface recovered to silicon wafer itself, it can be considered that previous observed deposited material was stripped by this processing. This is the indication that previous deposited material should be some type of carbon content material such as amorphous carbon or diamond like carbon. This result shows that this method can be used to produce carbon composite material film including diamond.

Fourth Example

In the present example, the mixed gas ($H_2$: 90 SCCM, $Cl_2$: 10 SCCM) used as the plasma source gas was activated the plasma with power at 500 watt and 2.45 GHz microwave in a tool similar to the one in FIG. 7. A lusterless 10 yen coin (composition: copper) and piece of iron ("lusterless" means such metal surfaces were oxidized.) were mounted on the stage. These metal samples were processed under the condition of pressure 2 Torr and processing time 3 minutes, then both 10 yen coin and piece of iron surfaces were resurrected their own luster. This result indicates that the metal oxides on the metal surfaces were removed and/or reduced by this processing method.

As above description, an atomic hydrogen plasma downstream processing with no or minimized influence of atomic oxygen and/or molecule containing oxygen atom can be performed by setting objective materials in the downstream of a plasma generated with a mixture of molecules containing a hydrogen atom as its element and halogen and/or halide.

In particular, since influence of oxygen form the reactor wall will be avoided by composing the reactor wall surface exposed to the plasma of silicon nitride, this invention makes it possible to grow amorphous and epitaxial films of silicon, which are significantly improved by a very low or little oxygen content, even in the temperature below 650° C. in which temperature range dopant in silicon does not diffuse. Therefore, this method provides one of the quantum device manufacturing processes.

In a specific embodiment, a flow rate of molecule of hydrogen-chloride or hydrogen-bromide, which is used as Gas-B in total Gas-C flow is defined as the ratio of an amount of hydrogen atom in Gas-B to that in Gas-A is larger than 1/480.

While the above is a full description of the specific embodiments, various modifications, alternative constructions and equivalents may be used. Therefore, the w above description and illustrations should not be taken as limiting the scope of the present invention which is defined by the appended claims.

What is claimed is:

1. A method of surface treatment in a substantially downstream position of a plasma source to substantially be free from an undesirable influence of a reactive species from the plasma source, where an object to be processed is downstream from the plasma source, the method comprising generating a plasma discharge including a gas-C, the gas-C comprising a Gas-A molecule including essentially hydrogen as an element and a Gas-B including essentially a halide; wherein said plasma discharge is substantially free from an oxygen bearing species; and wherein the Gas B is selected from hydrogen chloride or hydrogen bromide; wherein Gas C comprises a flow rate defined as a ratio of an amount of hydrogen atom in Gas-B to that in Gas-A is larger than 1/480, wherein exposing the object to be processed is exposed to atomic hydrogen from the plasma discharge.

2. The method of claim 1 further comprising injecting a Gas-D in the downstream of the plasma of Gas-C to treat the object comprising a surface in a downstream position of the Gas-D injection.

3. The method of claim 1, wherein Gas-B does not contain an oxygen atom.

4. The method of claim 2, wherein gas containing silicon as its element is used as Gas-D.

5. The method of claim 2, wherein gas containing carbon as its element is used as Gas-D.

6. The method of claim 2, wherein gas containing fluorine as its element is used as Gas-D.

7. The method of claim 1 wherein the method is provided to substantially prevent physical damage caused by a high energy particle.

8. A method of surface treatment in a substantially downstream position of a plasma source, where an object to be processed is downstream from the plasma source, the method comprising generating a plasma discharge including a gas-C, the gas-C comprising a Gas-A molecule including essentially hydrogen as an element and a Gas-B; wherein said plasma discharge is substantially free from an oxygen bearing species; and wherein the Gas B is selected from a halide of at least a chlorine, bromine, iodine, or fluorine; wherein Gas C comprises a flow rate defined as a ratio of an amount of hydrogen atom in Gas-B to that in Gas-A is larger than 1/480, wherein the object to be processed is exposed to atomic hydrogen from the poasma discharge.

9. The method of claim 8 further comprising injecting a Gas-D in the downstream of the plasma of Gas-C to treat the object comprising a surface in a downstream position of the Gas-D injection.

10. The method of claim 8 wherein Gas-B does not contain an oxygen atom.

11. The method of claim 8 wherein gas containing silicon as its element is used as Gas-D.

12. The method of claim 8 wherein gas containing carbon as its element is used as Gas-D.

13. The method of claim 8 wherein gas containing fluorine as its element is used as Gas-D.

14. The method of claim 8 wherein the method is provided to substantially prevent physical damage caused by a high energy particle.

* * * * *